(12) United States Patent
Qu

(10) Patent No.: US 11,175,535 B2
(45) Date of Patent: Nov. 16, 2021

(54) BACKLIGHT MODULE, LIQUID CRYSTAL DISPLAY, AND SPLICED DISPLAY DEVICE

(71) Applicant: Huizhou China Star Optoelectronics Technology Co., Ltd., Huizhou (CN)

(72) Inventor: Yaqi Qu, Huizhou (CN)

(73) Assignee: HUIZHOU CHINA STAR OPTOELECTRONICS TECHNOLOGY CO., LTD., Huizhou (CN)

( * ) Notice: Subject to any disclaimer, the term of this patent is extended or adjusted under 35 U.S.C. 154(b) by 254 days.

(21) Appl. No.: 16/109,788

(22) Filed: Aug. 23, 2018

(65) Prior Publication Data

US 2019/0310517 A1 Oct. 10, 2019

Related U.S. Application Data

(63) Continuation of application No. PCT/CN2018/092071, filed on Jun. 21, 2018.

(30) Foreign Application Priority Data

Apr. 10, 2018 (CN) .......................... 201810316422.8

(51) Int. Cl.
*G02F 1/13357* (2006.01)
*G02F 1/1333* (2006.01)
*H01L 27/32* (2006.01)

(52) U.S. Cl.
CPC .... *G02F 1/133608* (2013.01); *G02F 1/13336* (2013.01); *G02F 1/133606* (2013.01); *H01L 27/3293* (2013.01)

(58) Field of Classification Search
CPC combination set(s) only.
See application file for complete search history.

(56) References Cited

U.S. PATENT DOCUMENTS

| | | | |
|---|---|---|---|
| 2004/0228111 A1* | 11/2004 | Kuo ................ | G02F 1/133608 362/632 |
| 2005/0151895 A1* | 7/2005 | Fukuyoshi ........ | G02F 1/133308 349/58 |
| 2008/0079657 A1 | 4/2008 | Kee et al. | |
| 2008/0158468 A1* | 7/2008 | Kim .................. | G02F 1/13336 349/58 |
| 2012/0120325 A1* | 5/2012 | Shimizu ........... | G02F 1/133608 348/790 |

(Continued)

FOREIGN PATENT DOCUMENTS

| | | |
|---|---|---|
| CN | 101424823 A | 5/2009 |
| CN | 103578371 A | 2/2014 |

(Continued)

*Primary Examiner* — Lucy P Chien

(57) ABSTRACT

A backlight module, a liquid crystal display and a spliced display device are provided. The backlight module is configured to provide a back light source to the display panel. The backlight module includes a backlight panel. The backlight panel includes a frame and an opening; the opening corresponds to the display area of the display panel. The frame corresponds to the non-display area of the display panel. A first extension portion extends from the first subframe in a direction away from opening. In the above manner, the present application is capable of physically reducing the width of the seam between the two adjacent splicing screens by half.

16 Claims, 4 Drawing Sheets

(56) References Cited

U.S. PATENT DOCUMENTS

| | | | |
|---|---|---|---|
| 2017/0123274 A1* | 5/2017 | Jeong | G02F 1/13336 |
| 2017/0192273 A1 | 7/2017 | Fan | |
| 2018/0045881 A1* | 2/2018 | Gotou | G02B 6/005 |

FOREIGN PATENT DOCUMENTS

| | | |
|---|---|---|
| CN | 104090405 A | 10/2014 |
| KR | 20080072388 A1 | 8/2008 |

* cited by examiner

BACKLIGHT MODULE, LIQUID CRYSTAL DISPLAY, AND SPLICED DISPLAY DEVICE

CROSS-REFERENCE TO RELATED APPLICATIONS

The present disclosure is a continuation-application of International (PCT) Patent Application No. PCT/CN2018/092071, filed on Jun. 21, 2018, which claims foreign priority of Chinese Patent Application No. 201810316422.8 filed on Apr. 10, 2018 in the State Intellectual Property Office of China, the entire contents of which are hereby incorporated by reference.

TECHNICAL FIELD

Embodiments of the present disclosure generally relate to liquid crystal display technology, and in particular to a backlight module, a liquid crystal display and a spliced display device.

BACKGROUND

At present, a size of a single display screen is no greater than 80 inches. With the popularity of display technology and the increasing need for the size of display screen, screens splicing is becoming workable way to realize large-area display.

A splicing screen means that smaller-sized screens are spliced into a super-sized screen by means of a mode of array installation. To satisfy different needs in different application scenarios, the quantity of splicing screens can be decided according to actual demands, and the splicing screens are further spliced into large screens of various sizes. Nevertheless, because of the technical restriction, a black edging of a certain width without displaying anything will be left around a periphery of a display screen. When splicing a plurality of display screens together, it inevitably that a splicing seam with twice width at black edging would be left between screens. As a result, the image is segmented, which seriously damages the continuity and integrity of the image and affects users' visual experience.

In the related art, in order to achieve seamless splicing, glass should be placed in front of the splicing screen to eliminate the splicing seam through optical refraction. However, parts of the image will be deformed when using the optical method to eliminate the splicing seam. Therefore, it is necessary to reduce the width of the joint physically.

SUMMARY

The present disclosure provides a backlight module, a liquid crystal display and a spliced display device, which can reduce a width of a seam between the two adjacent spliced screens by half physically.

To solve the above-mentioned problem, a technical scheme adopted by the present disclosure is to provide a method for manufacturing a liquid crystal display; the liquid crystal display may include a display panel and a backlight module. The display panel may include a display area and a non-display area disposed around the display area. The backlight module may include a backlight panel, and the backlight panel may include an opening and a frame; the opening may correspond to the display area of the display panel. The frame may correspond to the non-display area of the display panel. The first extension portion extends from the first sub-frame in a direction away from opening, and a width of the first extension portion is equal to a width of the non-display area of the display panel; the backlight module may further include a light source, a diffusion plate, an optical film, and a support column supporting the diffusion plate and the optical film disposed in the backlight panel.

In order to solve the above technical problem, another technical solution adopted by the present disclosure provides a backlight module. The backlight module may include a backlight panel, and the backlight panel may include an opening and a frame; the opening may correspond to the display area of the display panel. The frame may correspond to the non-display area of the display panel. The first extension portion extends from the first sub-frame in a direction away from opening.

In order to solve the above technical problems, another technical solution adopted by the present disclosure provides a spliced display device, which may be spliced by a plurality of liquid crystal displays. The liquid crystal display may include a display panel and a backlight module. The display panel may include the display area and the non-display area disposed around the display area; the backlight module may include a backlight panel, and the backlight panel may include an opening and a frame; the opening may correspond to the display area of the display panel. The frame correspond to the non-display area of the display panel. The first extension portion extends from the first sub-frame in a direction away from opening.

In the present disclosure, a backlight module, a liquid crystal display and a spliced display device are provided. The first extension portion and the second extension portion may be disposed on the frame of the backlight module. The first extension of one backlight module may be vertically overlapped with the second extension of another backlight module, so that the width of the seam is the width of one extension portion, that is, half of the traditional side-by-side splicing.

BRIEF DESCRIPTION OF THE DRAWINGS

In order to illustrate more clearly the technical solutions in the embodiments of the present disclosure, the drawings used in the description of the embodiments will be briefly described below. It is obvious that the drawings in the following description are only some embodiments of the present disclosure. Other drawings may also be obtained from those of ordinary skill in the art in view of the drawings. In the drawings.

DETAILED DESCRIPTION

Figure 1:
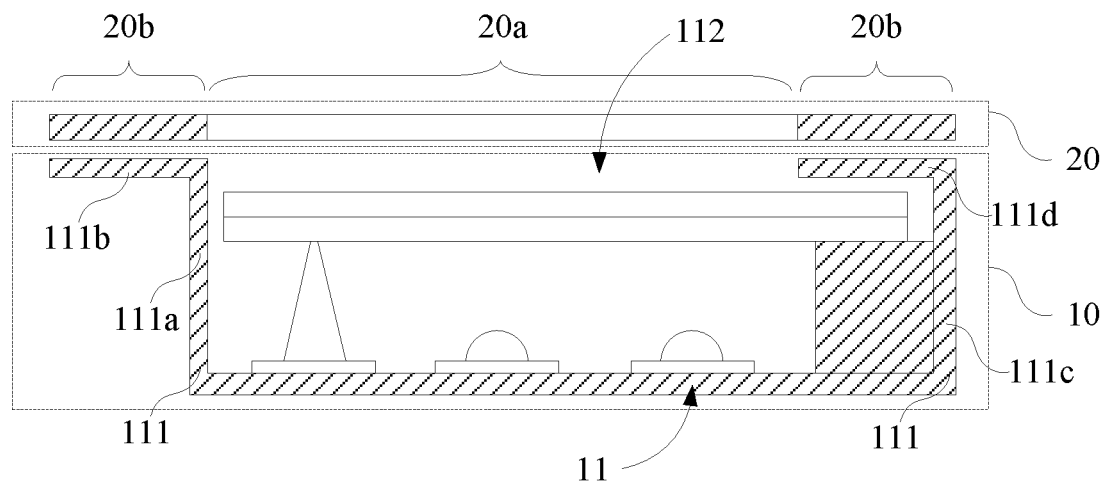
FIG. 1 is a structural view of a first embodiment of a liquid crystal display provided by the present disclosure.

The technical solutions in the embodiments of the present disclosure will be clearly and completely described in the following with reference to the accompanying drawings in the embodiments. It should be understood that the specific embodiments described herein are merely illustrative of the application and are not intended to be limiting. In addition, it should be noted that, for the convenience of description, only some but not all of the structures related to the present disclosure are shown in the drawings. Based on the embodiments of the present disclosure, all other embodiments obtained by those skilled in the art without departing from the inventive scope are the scope of the present disclosure.

The terms "first", "second", and the like in the present disclosure are used to distinguish different objects, and are not intended to describe a particular order. Furthermore, the terms "comprises", "comprising" and "comprising" are intended to cover a non-exclusive inclusion. For example, a process, method, system, product, or device that comprises a series of steps or units is not limited to the listed steps or units, but optionally also includes steps or units not listed, or, optionally, other steps or units inherent to these processes, methods, products or equipment.

The term "an embodiment" recited in the present disclosure herein means that a particular feature, structure, or characteristic described in connection with the embodiments can be included in at least one embodiment of the present disclosure. The appearances of the terms in various places in the specification are not necessarily referring to the same embodiments, and are not exclusive or alternative embodiments that are mutually exclusive. Those skilled in the art will explicitly and implicitly understand that the embodiments described herein can be combined with other embodiments.

Referring to FIG. 1, FIG. 1 is a structural view of a first embodiment of a liquid crystal display provided by the present disclosure. The liquid crystal display may include a backlight module 10 and a liquid crystal display 20. The backlight module 10 may include a backlight panel 11, and the backlight panel 11 may include a frame 111 and an opening 112. The opening 112 may correspond to a display area 20a of the display panel 20, and the frame 111 may correspond to a non-display area 20b of the display panel 20. A first extension portion 111b may extend from a first sub-frame 111a of the frame 111 in a direction away from the opening 112.

Further, the frame 111 may include a second sub-frame 111c opposite to the first sub-frame 111a, and a second extension portion 111d may extend from the second sub-frame 111c in a direction toward the opening 112. In this embodiment, the first sub-frame 111a and the second sub-frame 111c are equal in height and symmetrical, and the first extension portion 111b and the second extension portion 111d are equal in width and symmetrical.

Figure 2:
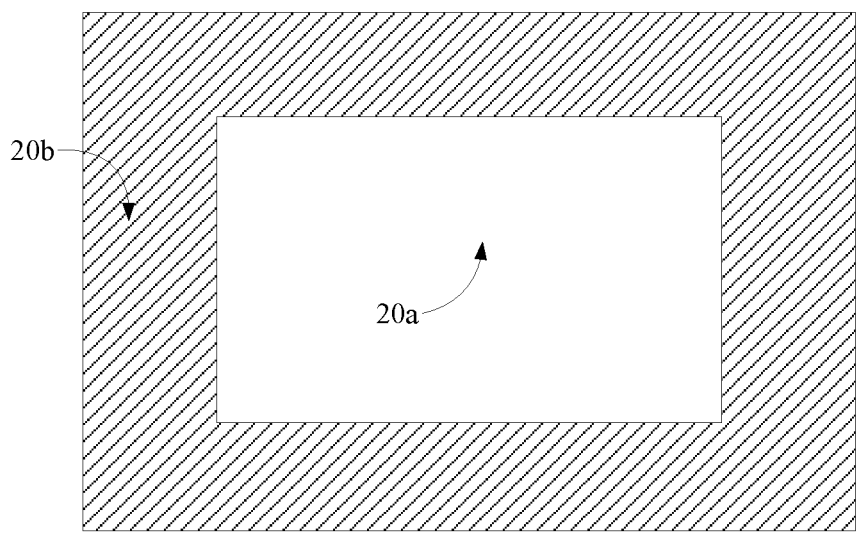
FIG. 2 is a structural view of the display panel 20 in FIG. 1.

FIG. 2 is a structural view of the display panel 20 of FIG 1. As shown in FIG. 2, the display panel 20 may include a central display area 20a (or an effective display area, that is, an AA (Active Area) area) and a non-display area 20b disposed around the display area 20a. The non-display area 20b may be a binding area of the display panel 20, in which a driving circuit is provided, which will not be described in detail herein.

It can be understood that, in this embodiment, the opening 112 of the backlight panel 11 may correspond to the display area 20a of the display panel 20; the frame 111 may correspond to the non-display area 20b of the display panel 20; the first extension portion 111b may extend in a direction away from the opening 112; the second extension portion 111d may extend in a direction toward the opening 112. Therefore, the first extension portion 111b and the second extension portion 111d may correspond to the non-display area 20b on both sides of the display panel 20 respectively.

Figure 3:
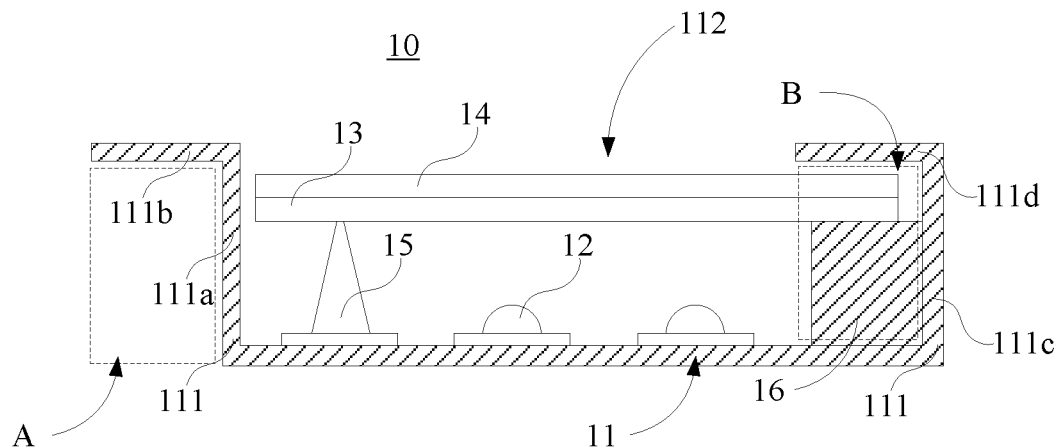
FIG. 3 is a structural view of the backlight module 10 in FIG. 1.

Referring to FIG. 3, FIG. 3 is a structural view of the backlight module 10 of FIG. 1. The first sub-frame 111a and the first extension portion 111b may cooperatively define a first receiving space A outside the backlight panel 11. The second sub-frame 111c and the second extension portion 111d may cooperatively define a second receiving space B located inside the backlight panel 11. As can be seen from FIG. 1, the first receiving space A and the second receiving space B may also correspond to the non-display area 20b on both sides of the display panel 20 respectively.

Referring further to FIG. 2, the backlight module may further include a light source 12, a diffusion plate 13, an optical film 14, and a support column 15 (also called as a support post) supporting the diffusion plate 13 and the optical film 14 disposed in the backlight panel 11. In addition, a boss 16 may be provided below the second extension portion 111d (i.e., the second receiving space B), and the boss 16 may support the diffusion plate 13 and the optical film 14 together with the support column 15.

Optionally, in this embodiment, the first support portion 15 may be made of transparent material, and the boss is not limited in materials. Due to the arrangement of the first support portion 15, the light emitted from the light source 12 in this embodiment may not be blocked by the first support portion 15, and the edge of the display area 20a in the display panel may not be dark. The first support portion 15 in this embodiment may specifically be in shape of a column, and alternatively may in shape of a taper. Of course, in other embodiments, the first supporting portion 15 may also be in shape of a cylinder, a rectangular parallelepiped or the like. The shape of the first supporting portion 15 will not be further limited herein.

Figure 4:
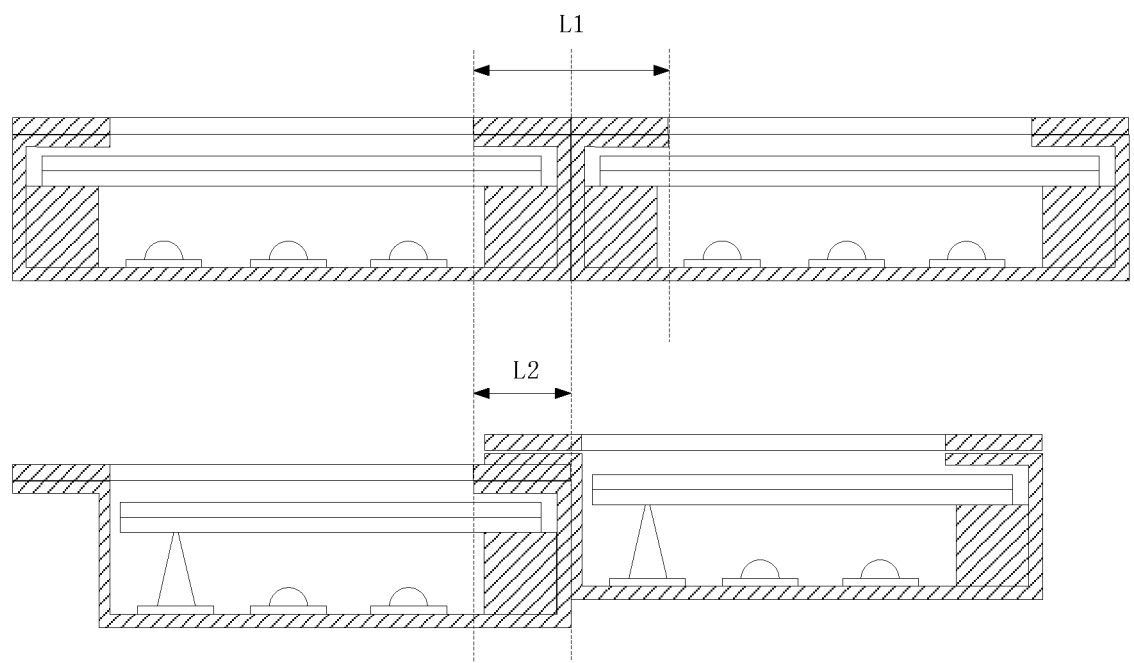
FIG. 4 is a comparison view between the splice of the liquid crystal display in FIG. 1 and the splice of a liquid crystal display in the related art.

Combined with FIG. 4, FIG. 4 is a comparison view between the splice of the liquid crystal display in FIG. 1 and the splice of a liquid crystal display in the related art. The upper part of FIG. 4 illustrates the splicing of the liquid crystal display in the related art, and the lower part of FIG. 4 illustrates the splicing of the liquid crystal display of FIG. 1.

It can be understood that, in the related art, the two sides of the liquid crystal display are provided with the boss structure as shown in FIG. 1. Two ends of the backlight panel may be aligned with outer edges of the display panel, and no receiving space is defined outside the backlight panel. When splicing the liquid crystal display, the two liquid crystal displays are directly and closely attached to each other, and the non-display areas respectively of the two liquid crystals are included in the place where the two liquid crystal displays are closely attached, so that the display areas of the two adjacent liquid crystal displays are displayed. In this way, a seam width L1 between the display areas of the two adjacent liquid crystal displays may be equivalent to twice the width of the non-display area of a liquid crystal display.

Referring to the splicing of the liquid crystal display in the present embodiment, in combination with FIG. 1, FIG. 3 and FIG. 4, the first receiving space A may be formed by the first sub-frame 111a and the first extension portion 111b. In this way, the non-display area of another liquid crystal display may be accommodated in the first receiving space. The first extension portion 111b of the first liquid crystal display may be disposed above the non-display area 20b corresponding to the second extension portion 111d of the second liquid crystal display. The first sub-frame 111a of the first liquid crystal display may be disposed at the right side of the second sub-frame 111c of the second liquid crystal display. That is, the area surrounded by the non-display area 20b, the second extension portion 111d, and the second sub-frame 111c of the second liquid crystal display may be disposed in the first receiving space A of the first liquid crystal display.

Therefore, with such a splicing method, in the embodiments of the present disclosure, the seam width L2 between the display areas respectively of two adjacent liquid crystal displays may be half of L1.

In the above embodiment, the shape of the backlight panel is changed, and a receiving space may be defined outside the frame of the backlight panel. In this way when a plurality of liquid crystal displays need to be spliced together to form an oversized screen, only the manner as shown in FIG. 4 needs to be adopted to perform splicing. The first extension portion and the second extension portion may be disposed on the frame of the backlight module, and the first extension portion of one backlight module and the second extension portion of another backlight module may be vertically overlapped and spliced together, so that the seam width may be equal to the width of one extension portion, which is half of the seam width in the traditional side-by-side splicing.

Figure 5:
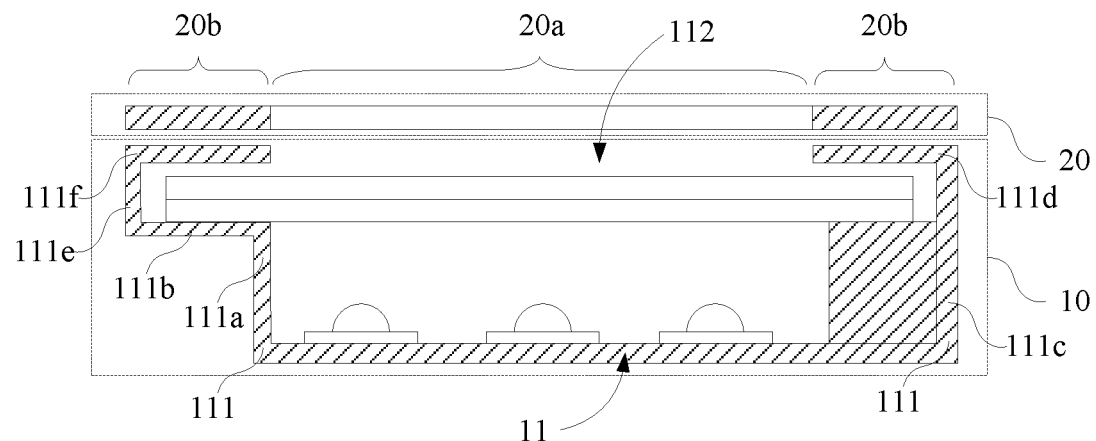
FIG. 5 is a structural view of a second embodiment of a liquid crystal display provided by the present disclosure.

Referring to FIG. 5, FIG. 5 is a structural view of a second embodiment of a liquid crystal display provided by the present disclosure. The liquid crystal display may include a backlight module 10 and a liquid crystal display 20. The backlight module 10 may include a backlight panel 11, and the backlight panel 11 may include a frame 111 and an opening 112. The opening 112 may correspond to a display area 20a of the display panel 20, and the frame 111 may correspond to a non-display area 20b of the display panel 20.

The frame 111 may include a first sub-frame 111a and a second sub-frame 111c opposite to the first sub-frame 111a.

Further, a first extension portion 111b may extend from the first sub-frame 111a in a direction away from the opening 112. A third extension portion 111e may extend from an end of the first extension portion 111b that is away from the first sub-frame 111a in a direction toward the display panel 20. A fourth extension portion 111f may extend from an end of the third extension portion 111e that is away from the first extension portion 111b in a direction toward the opening 112. That is to say, the first sub-frame 111a, the first extension portion 111b, the third extension portion 111e, and the fourth extension portion 111f may connected to one another successively. Likewise, a second extension portion 111d may extend from the second sub-frame 111c in the direction towards the opening 112. Heights of the first sub-frame 111a and the third extension portion 111e may correspond to that of the second sub-frame 111c respectively, and the fourth extension portion 111f and the second extension portion 111d may be symmetrically disposed.

In this embodiment, a receiving space defined by the first extension portion 111b, the third extension portion 111e and the fourth extension portion 111f may be configured to receive the diffusion plate and the optical film. The first extension portion 111b may be served as a step for disposing the diffusion plate and the optical film, such that there is no need to additionally provide a boss and a support column.

Further, the first sub-frame 111a and the first extension portion 111b may be still enclosed to define a receiving space outside the backlight panel 11, without arranging additional bosses and supporting columns. In the manner shown in FIG. 4, the splicing of the two liquid crystal displays can still be completed.

The present embodiment may be the same as the above embodiment, and the seam width can be reduced so that the seam width after splicing can be half of the conventional side-by-side splicing. However, due to the presence of the receiving space defined by the first extension portion 111b, the third extension portion 111e, and the fourth extension portion 111f, a thickness of the splicing portion may be increased.

Figure 6:
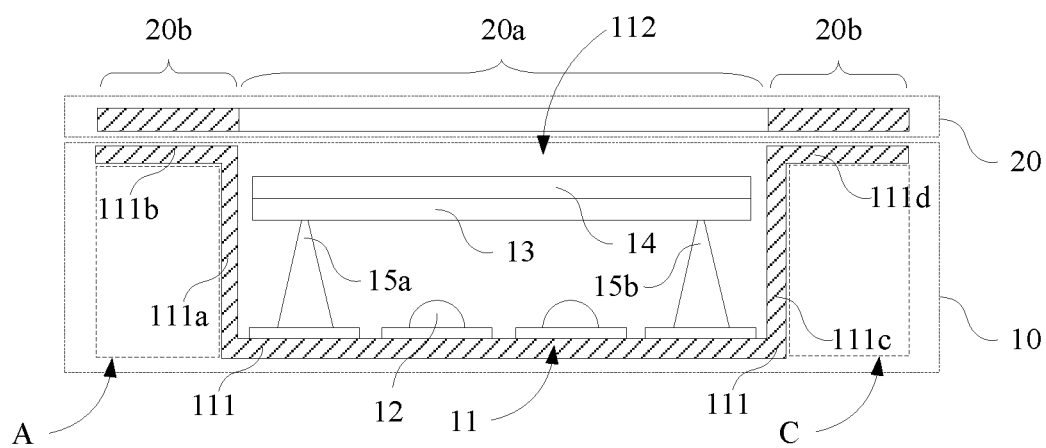
FIG. 6 is a structural view of a third embodiment of a liquid crystal display provided by the present disclosure.

Referring to FIG. 6, FIG. 6 is a structural view of a third embodiment of a liquid crystal display provided by the present disclosure. The liquid crystal display may include a backlight module 10 and a liquid crystal display 20, wherein the backlight module 10 may include a backlight panel 11, and the backlight panel 11 may include a frame 111 and an opening 112. The opening 112 may correspond to the display area 20a of the display panel 20, and the frame 111 may correspond to the iron-display area 20b of the display panel 20.

Further, the frame 111 may include a first sub-frame 111a and a second sub-frame 111c opposite to the first sub-frame 111a. A first extension portion 111d may extend from the first sub-frame 111a in a direction toward the opening 112. A second extension portion 111d may extend from the second sub-frame 111c in a direction toward the opening 112. The first extension portion 111b and the second extension portion 111d may be symmetrical.

The backlight module may further include a light source 12, a diffusion plate 13, an optical film 14, and a plurality of support columns 15 (also called as support posts) supporting the diffusion plate 13 and the optical film 14 disposed in the backlight panel 11. The plurality of support columns 15 may include a first support column 15a and a second support column 15b, which are transparent and equal in height. The first support column 15a may be adjacent to the first sub-frame 111a, and the second support column 15b may be adjacent to the second sub-frame 111c, the first support column 15a may be configured to support one ends respectively of the diffusion plate 13 and the optical film, and the second support column 15b may be configured to support the other ends of the diffusion plate 13 and the optical film 14 respectively.

Optionally, the width of the first extension portion 111b may be equal to that of the second extension portion 111d. The widths of the first extension portion 111b and the second extension portion 111d may be equal to that of the non-display area 20b of the display panel.

It can be understood that, in the related art, the two sides of the liquid crystal display are provided With the boss structure as shown in FIG. 1. Two ends of the backlight panel may be aligned with outer edges of the display panel, and no receiving space may be defined outside the backlight panel. When splicing the liquid crystal display, the two liquid crystal displays are directly and closely attached to each other, and the non-display areas of the two liquid crystals are included in the place where the two liquid crystal displays are closely attached, so that the display areas of the two adjacent liquid crystal displays are displayed. In this way, a seam width L1 between the display areas of the two adjacent liquid crystal displays may be equivalent to twice the width of the non-display area of a liquid crystal display.

Figure 7:
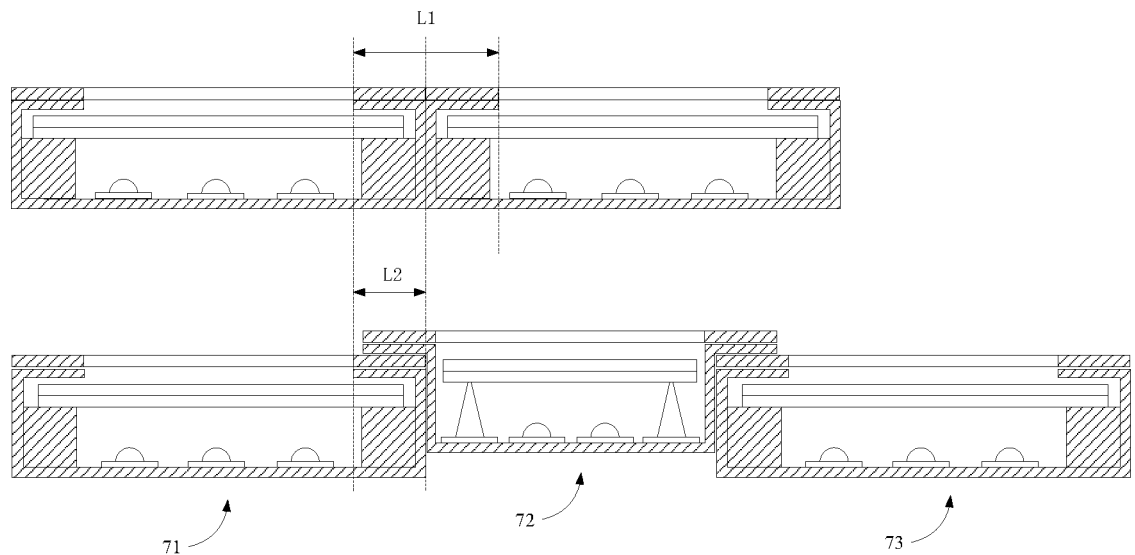
FIG. 7 is a comparison view of the splice of the liquid crystal display in FIG. 6 and the splice of the liquid crystal display in the related art.

Referring to the splicing of the liquid crystal display in the present embodiment, in combination with FIG. 6 and FIG. 7, the first receiving space A may be formed by the first sub-frame 111a and the first extension portion 111b. The third receiving space C may be formed by the second sub-frame 111c and the second extension portion 111d. The first receiving space A and the third receiving space C could accommodate the non-display areas of two other liquid crystal displays.

Having two receiving spaces A and C, the liquid crystal display in the present embodiment can be spliced with the liquid crystal display in the related art. As shown in FIG. 7, FIG. 7 is a comparison view of the splice of the liquid crystal display in FIG. 6 and the splice of the liquid crystal display in the related art. As is shown in FIG. 7, the first liquid crystal display 71 and the third liquid crystal display 73 are liquid crystal displays in the related art, and the second liquid crystal display 72 is the liquid crystal display provided in the present embodiment. Specifically, a part of the first liquid crystal display 71 may be accommodated in the first receiving space A of the second liquid crystal display, and a part of the third liquid crystal display 73 may be accommodated in the third receiving space C of the second liquid crystal display.

Therefore, with such a splicing method, in the embodiments of the present disclosure, the seam width L2 between the display areas respectively of two adjacent liquid crystal displays may be half of L1. Besides, it is possible to use the liquid crystal display in the related art, such that the cost may be reduced.

It can be understood that, in the above embodiments, the backlight module in the liquid crystal display can be manufactured and sold as products solely. The combining and splicing principles are similar to the above embodiments. The details are not described herein again.

Figure 8:
FIG. 8 is a structural view of an embodiment of a spliced display device provided in the present disclosure.

Referring to FIG. 8, FIG. 8 is a structural view of an embodiment of a spliced display device provided in the present disclosure. The spliced display device may be formed by splicing a plurality of liquid crystal displays.

In the present embodiment, the spliced display device 80 may be formed by splicing nine liquid crystal displays 81 arranged in an array. Specifically, the array may be in the form of three rows and three columns. Of course, in other embodiments, the number of liquid crystal displays 81 can be determined according to the size of the display device that is specifically required.

Specifically, the splicing manner of the liquid crystal display in this embodiment can refer to the embodiments respectively described in FIG. 4 and FIG. 7, which will not be described in detail herein.

In summary, those skilled in the art can easily understand that the present disclosure provides a backlight module, a liquid crystal display, and a spliced display device. By defining a receiving space in the backlight module, another liquid crystal display can be received; the space occupied by the non-display area can be reduced when the two liquid crystal displays are spliced together. Further, in the splicing manner, the first extension portion and the second extension portion are disposed on the frame, and the first extension portion of one backlight module and the second extension portion of another backlight module may be vertically overlapped and spliced together, so that the seam width may be equal to the width of one extension portion, that is, half of the traditional side-by-side splicing.

The above description is only the embodiments of the present disclosure without limiting the scope of the patent application. The scope of patent protection of the present disclosure includes any equivalent structure or equivalent process transformation which are made by using the specification and the drawings of the present disclosure, and also includes direct or indirect application to other related technologies.

What is claimed:

1. A liquid crystal display, comprising:
   a display panel, comprising a display area and a non-display area disposed around the display area; and
   a backlight module, comprising a backlight panel; wherein the backlight panel comprises:
   an opening, corresponding to the display area of the display panel;
   a frame, corresponding to the non-display area of the display panel; wherein the frame comprises a first sub-frame and a first extension portion; the first extension portion extends from the first sub-frame in a direction away from the opening; the first extension portion comprises a first point and a second point, the first point being closer to the first sub-frame than the second point; the first point is closer to the opening than the second point; a width of the first extension portion is equal to a width of the non-display area of the display panel; and
   a light source, a diffusion plate, an optical film, and a support column supporting the diffusion plate and the optical film disposed in the backlight panel;
   wherein the non-display area completely covers the first sub-frame and the first extension portion;
   wherein the frame comprises a second sub-frame opposite to the first sub-frame and a second extension portion extending from the second sub-frame in a direction away from the opening; the second extension portion comprises a third point and a fourth point, the third point being closer to the second sub-frame than the fourth point; the third point is closer to the opening than the fourth point; the second extension portion and the first extension portion are symmetrical.

2. The liquid crystal display of claim 1, wherein a boss is provided below the second extension portion; the boss and the support column together support the diffusion plate and the optical film.

3. The liquid crystal display of claim 1, wherein the support column is a plurality of support columns comprising a first support column and a second support column that are transparent and equal in height; the first support column is adjacent to the first sub-frame, and the second support column is adjacent to the second sub-frame; the first support column is configured to support one end of the diffusion plate and the optical film, and the second support column is configured to supporting the other end of the diffusion plate and the optical film.

4. The liquid crystal display of claim 1, wherein a width of the first extension portion is equal to that of the second extension portion.

5. The liquid crystal display of claim 1, wherein the support column is tapered.

6. A backlight module configured to provide a backlight to a display panel, comprises a backlight panel; wherein the backlight panel comprises:
   an opening, corresponding to a display area of the display panel; and
   a frame, corresponding to a non-display area of the display panel; wherein the frame comprises a first sub-frame and a first extension portion; the first extension portion extends from the first sub-frame in a direction away from the opening; the first extension portion comprises a first point and a second point, the first point being closer to the first sub-frame than the second point; the first point is closer to the opening than the second point;
   wherein the non-display area completely covers the first sub-frame and the first extension portion;
   wherein the frame comprises a second sub-frame opposite to the first sub-frame and a second extension portion extending from the second sub-frame in a direction away from the opening; the second extension portion comprises a third point and a fourth point, the third point being closer to the second sub-frame than the fourth point; the third point is closer to the opening than the fourth point; the second extension portion and the first extension portion are symmetrical.

7. The backlight module of claim 6, further comprising a light source, a diffusion plate, an optical film, and a support column supporting the diffusion plate and the optical film disposed in the backlight panel.

8. The backlight module of claim 7, wherein a boss is provided below the second extension portion; the boss and the support column together support the diffusion plate and the optical film.

9. The backlight module of claim 6, wherein
the support column is a plurality of support columns comprising a first support column and a second support column that are transparent and equal in height; the first support column is adjacent to the first sub-frame, and the second support column is adjacent to the second sub-frame; the first support column is configured to support one end of the diffusion plate and the optical film, and the second support column is configured to supporting the other end of the diffusion plate and the optical film.

10. The backlight module of claim 6, wherein a width of the first extension portion is equal to that of the second extension portion.

11. The backlight module of claim 6, wherein the support column is tapered.

12. The backlight module of claim 7, wherein
a width of the first extension is equal to a width of the non-display area of the display panel.

13. A spliced display device spliced by a plurality of liquid crystal displays, comprising:
a display panel, comprising a display area and a non-display area disposed around the display area; and
a backlight module, comprising a backlight panel; wherein the backlight panel comprises:
an opening, corresponding to the display area of the display panel; and
a frame, corresponding to the non-display area of the display panel; wherein the frame comprises a first sub-frame and a first extension portion; the first extension portion extends from the first sub-frame in a direction away from the opening; the first extension portion comprises a first point and a second point, the first point being closer to the first sub-frame than the second point; the first point is closer to the opening than the second point;
wherein the non-display area completely covers the first sub-frame and the first extension portion;
wherein the frame comprises a second sub-frame opposite to the first sub-frame and a second extension portion extending from the second sub-frame in a direction away from the opening; the second extension portion comprises a third point and a fourth point, the third point being closer to the second sub-frame than the fourth point; the third point is closer to the opening than the fourth point; the second extension portion and the first extension portion are symmetrical.

14. The spliced display device according to claim 13, wherein the backlight module further comprises a light source, a diffusion plate, an optical film, and a support column supporting the diffusion plate and the optical film disposed in the backlight panel.

15. The spliced display device according to claim 14, wherein a boss is provided below the second extension portion; the boss and the support column together support the diffusion plate and the optical film.

16. The spliced display device according to claim 13, wherein the support column is a plurality of support columns comprising a first support column and a second support column that are transparent and equal in height; the first support column is adjacent to the first sub-frame, and the second support column is adjacent to the second sub-frame; the first support column is configured to support one end of the diffusion plate and the optical film, and the second support column is configured to supporting the other end of the diffusion plate and the optical film.

* * * * *